United States Patent [19]

Matsubara

[11] Patent Number: 5,726,501
[45] Date of Patent: Mar. 10, 1998

[54] SEMICONDUCTOR DEVICE HAVING A SOLDER DRAWING LAYER

[75] Inventor: Hiroshi Matsubara, Nara, Japan

[73] Assignee: Sharp Kabushiki Kaisha, Osaka, Japan

[21] Appl. No.: 464,077

[22] Filed: Jun. 5, 1995

[30] Foreign Application Priority Data

Nov. 22, 1994 [JP] Japan .................. 6-288133

[51] Int. Cl.$^6$ ............ H01L 23/48; H01L 23/52; H01L 29/40
[52] U.S. Cl. ............ 257/778; 257/737; 257/779; 257/772
[58] Field of Search .................. 257/738, 778, 257/9, 737, 772

[56] References Cited

U.S. PATENT DOCUMENTS

| | | | |
|---|---|---|---|
| 3,697,828 | 10/1972 | Oakes | 257/738 |
| 4,710,798 | 12/1987 | Marcantonio | 257/778 |
| 5,046,161 | 9/1991 | Takada | 257/738 |
| 5,075,965 | 12/1991 | Carey et al. | 257/778 |

FOREIGN PATENT DOCUMENTS

| | | |
|---|---|---|
| 1 209736 | 8/1989 | Japan . |
| 5 121488 | 5/1993 | Japan . |

OTHER PUBLICATIONS

Rajac, "Integrated Circuit Structure Including Solder & Lead Frame", IBM TDM vol. 16 No. 6 Nov. 1973, pp. 1738-1739.

*Primary Examiner*—Mahshid D. Saadat
*Assistant Examiner*—T. M. Arroyo

[57] ABSTRACT

A semiconductor device according to the present invention to be mounted on a mounting substrate includes: a connection electrode formed on a surface of the semiconductor device; a solder bump formed on the connection electrode, the solder bump electrically and mechanically connecting the connection electrode with a substrate electrode formed on the mounting substrate; and a solder drawing layer provided on the surface of the semiconductor device in a periphery of the solder bump and having a surface portion composed of a solder-agreeable metal, the solder drawing layer retracting melted solder of the solder bump onto a surface of the solder drawing layer by contact with the melted solder.

18 Claims, 9 Drawing Sheets

SEMICONDUCTOR DEVICE HAVING A SOLDER DRAWING LAYER

BACKGROUND OF THE INVENTION

1. Field of the Invention

The present invention relates to a semiconductor device, a semiconductor device-mounted apparatus, and a method for replacing semiconductor devices. In particular, the present invention relates to: the structure of a semiconductor device in the vicinity of electrodes thereof, the semiconductor device including solder bumps; a semiconductor device-mounted apparatus including the semiconductor device mounted on a substrate; and a method for replacing the semiconductor device of the semiconductor device-mounted apparatus.

2. Description of the Related Art

In view of the recent trends in electronic devices toward smaller sizes and lighter weight, various methods for mounting semiconductor devices at a high density have been studied. Methods in which semiconductor devices such as semiconductor chips or semiconductor packages are mounted on a substrate via solder bumps have been put to practical use as a technique which is capable of achieving mounting at the highest density at present.

However, a semiconductor device-mounted apparatus in which a semiconductor device is mounted on a substrate with solder bumps has a problem relating to the replacement of the semiconductor device.

Specifically, a semiconductor device which requires replacing on a substrate is usually removed from the substrate in a state where the solder bumps are melted by a heating treatment. However, a portion of the solder is likely to remain on electrodes of the substrate after the removal of the semiconductor device. The amount of the solder residue varies among the electrodes of the substrate. As a result, there may occur the problem of short-circuiting due to excessive amounts of solder residue, or the problem of malconnection due to the variation in the amount of solder residue when a substitute semiconductor device is connected to the substrate in the case of replacing the device.

In order to solve the above-mentioned problems, various measures have been devised. For example, Japanese Laid-Open Publication No. 1-209736 discloses a method in which a thin metal film having good wettability with solder is pressed onto the solder residue on the electrodes of the substrate after a semiconductor device is removed from a substrate, the thin metal film being formed on a silicon plate, and a heat treatment is conducted so that the solder residue is drawn onto the silicon plate, thereby removing the solder residue from the electrodes of the substrate.

Japanese Laid-Open Publication No. 5-121488 discloses a substrate which includes extra electrodes, as well as primary electrodes, for future replacement of the semiconductor device mounted thereon. This substrate allows a substitute semiconductor device to be soldered onto the extra electrodes after removing the old semiconductor device that has been soldered onto the primary electrodes. Thus, the problems of short-circuiting and malconnection of the substitute semiconductor device due to solder residues remaining on the electrodes after removing the old semiconductor device are prevented from happening.

However, the method disclosed in Japanese Laid-Open Publication No. 1-209736 has problems in that a silicon plate having solder-agreeable metal formed thereon is required and that an additional step of absorbing the solder residue with the silicon plate after the removal of the semiconductor device is required, thus leading to a complicated process. The substrate disclosed in Japanese Laid-Open Publication No. 5-121488 also has problems in that some electrode arrangement patterns do not allow the incorporation of such extra electrodes on the substrate, and that the substrate does not support the cases where the replacement of the semiconductor device must be conducted a large number of times.

SUMMARY OF THE INVENTION

A semiconductor device according to the present invention to be mounted on a mounting substrate includes: a connection electrode formed on a surface of the semiconductor device; a solder bump formed on the connection electrode, the solder bump electrically and mechanically connecting the connection electrode with a substrate electrode formed on the mounting substrate; and a solder drawing layer provided on the surface of the semiconductor device in a periphery of the solder bump and having a surface portion composed of a solder-agreeable metal, the solder drawing layer retracting melted solder of the solder bump onto a surface of the solder drawing layer by contact with the melted solder.

In one embodiment of the invention, the solder drawing layer is provided only in a vicinity of the solder bump on the surface of the semiconductor device.

In another embodiment of the invention, the solder drawing layer is formed substantially over an entire area of the surface of the semiconductor device except for a region in which the connection electrode is located.

In still another embodiment of the invention, the connection electrode formed on the surface of the semiconductor device has a circular shape and the solder drawing layer has a ring shape surrounding the connection electrode.

In still another embodiment of the invention, the solder drawing layer is formed substantially over an entire area of the surface of the semiconductor device except for a region in which the connection electrode is located, and the solder drawing layer is divided into a plurality of regions so as to correspond to a predetermined number of the connection electrodes.

In still another embodiment of the invention, the connection electrode formed on the surface of the semiconductor device has a square shape, and the solder drawing layer is formed so as to surround the connection electrode.

In still another embodiment of the invention, the connection electrode formed on the surface of the semiconductor device has a circular shape, and the connection electrode is disposed at a distance from the solder drawing layer disposed in a vicinity of the connection electrode, the distance accounting for 5% to 30% of a diameter of the solder bump.

In still another embodiment of the invention, a sum of an area occupied by one connection electrode and an area occupied by one solder drawing layer corresponding to one connection electrode is equal to or greater than 1.25 times an area of one substrate electrode corresponding to the one connection electrode.

A semiconductor device-mounted apparatus according to the present invention includes a semiconductor device mounted on a mounting substrate, wherein the mounting substrate includes a substrate electrode formed in a predetermined position of a surface of the mounting substrate. The semiconductor device includes: a connection electrode formed on a surface of the semiconductor device; a solder bump formed on the connection electrode, the solder bump electrically and mechanically connecting the connection electrode with the substrate electrode of the mounting substrate; and a solder drawing layer provided on the surface of the semiconductor device in a periphery of the solder bump and having a surface portion composed of a solder-agreeable metal, the solder drawing layer retracting melted solder of the solder bump onto a surface of the solder drawing layer by contact with the melted solder.

In one embodiment of the invention, the solder drawing layer is provided only in a vicinity of the solder bump on the surface of the semiconductor device.

In another embodiment of the invention, the solder drawing layer is formed substantially over an entire area of the surface of the semiconductor device except for a region in which the connection electrode is located.

In still another embodiment of the invention, the mounting substrate includes a solder resist formed in a periphery of the substrate electrode, the solder resist preventing the solder from flowing off the substrate electrode.

A method for replacing the semiconductor device of the semiconductor device-mounted apparatus according to the present invention includes the steps of: moving the semiconductor device closer to the mounting substrate while heating the semiconductor device at a temperature that allows the solder to melt, thereby allowing the melted solder of the solder bump between the connection electrode and the substrate electrode to contact with the solder drawing layer provided in a vicinity of the connection electrode; cooling the semiconductor device so as to solidify the melted solder in a condition where the melted solder is spread over the surface of the solder drawing layer in the vicinity of the connection electrode; removing the semiconductor device from the substrate by applying physical force to the semiconductor device on the substrate so that the solidified solder is severed off the substrate electrode of the mounting substrate; and mounting another semiconductor device on a portion of the substrate where the semiconductor device has been removed.

In one embodiment of the invention, the method including the steps of: moving the semiconductor device closer to the mounting substrate while heating the semiconductor device at a temperature that allows the solder to melt, thereby allowing the melted solder of the solder bump between the connection electrode and the substrate electrode to contact with the solder drawing layer provided in a vicinity of the connection electrode; lifting the semiconductor device from the mounting substrate so that the melted solder is retracted from the mounting substrate to the semiconductor device, thereby removing the semiconductor device from the substrate; and mounting another semiconductor device on a portion of the substrate where the semiconductor device has been removed.

A semiconductor device and a semiconductor device-mounted apparatus according to the present invention include a solder drawing layer which draws melted solder onto the surface thereof by contact with the melted solder bumps, the solder drawing layer being provided in a periphery of the solder bumps and having a surface composed of a solder-agreeable metal. When a semiconductor device is removed from a substrate, the semiconductor device is brought closer to the substrate while heating the semiconductor device at a temperature that allows the solder to melt, so that the melted solder between connection electrodes of the semiconductor device and substrate electrodes of the substrate is drawn onto the solder drawing layer provided in the vicinity of the solder bumps. As a result, most of the solder present in the portion connecting the connection electrodes and the substrate electrodes is retracted to the semiconductor device side. When the semiconductor device is pulled away from the substrate, most solder, as well as the semiconductor device, is removed from the substrate electrodes.

The removal of the semiconductor device from the substrate is performed simply by pressing the semiconductor device toward the substrate while being heated and pulling away the semiconductor device from the substrate. Moreover, solder residues remaining on the substrate electrodes when the semiconductor device is removed from the substrate can be substantially eliminated, so that the connection electrodes of the semiconductor device can be repeatedly soldered to electrodes of the substrate. As a result, more than one replacement of the semiconductor device is enabled.

According to the present invention, the solder drawing layer is formed only in the vicinity of the solder bumps on the surface of the semiconductor device, so that the difference in the coefficients of thermal expansion between the material constituting the semiconductor device and the material constituting the solder drawing layer is prevented from deforming the semiconductor device. Furthermore, since no metal layer is provided in regions where active elements are formed, the characteristics of the device are prevented from being unfavorably affected. The solder bumps connecting the substrate electrodes with the connection electrodes are melted so as to be drawn onto the solder drawing layer and thereafter solidified by cooling, after which the semiconductor device is pulled off with force applied in a direction parallel to the substrate. As a result, the solder is severed in the vicinity of the substrate electrode due to a difference between the semiconductor device side and the mounting substrate side in the areas of the portions which the solder connects with. Therefore, the semiconductor device can be removed without leaving much solder residues on the substrate electrodes of the substrate.

In a method for replacing semiconductor devices according to the present invention, a semiconductor device is brought closer to a substrate side while heating the semiconductor device at a temperature that allows the solder to melt so that the melted solder of solder bumps contacts with a solder drawing layer provided in the vicinity of the solder bumps, and thereafter the semiconductor device is cooled so as to solidify the solder. Subsequently, the semiconductor device is pulled off with physical force so that the solidified solder is severed off electrodes of the substrate. As a result, the solder is severed in the vicinity of the substrate electrode due to a difference between the semiconductor device side and the mounting substrate side in the areas of the portions which the solder connects with. Therefore, the semiconductor device can be removed without leaving much solder residues on the substrate electrodes of the substrate.

As a result, the replacement of the semiconductor device on the substrate can be performed a large number of times without employing any special operation members or increasing the number of steps to be performed.

Alternatively, in a method for replacing semiconductor devices according to the present invention, the semiconductor device is brought closer to the substrate side while heating the semiconductor device at a temperature that allows the solder to melt so that the melted solder of the solder bumps contacts with the solder drawing layer provided in the vicinity thereof, and thereafter the semiconductor device is lifted up away from the substrate electrodes of the substrate, thereby removing the semiconductor device from the substrate. This allows the semiconductor device to be pulled off the substrate with the melted solder being spread over the solder drawing layer. As a result, only a very small amount of solder remains on the electrodes of the substrate. As a result, the replacement of the semiconductor device on the substrate can be performed a large number of times without employing any special operation members or increasing the number of steps to be performed.

Thus, the invention described herein makes possible the advantages of (1) providing a semiconductor device having such a structure that substantially eliminates any solder residue remaining on electrodes of a substrate after removing the semiconductor device from the substrate, thereby allowing the semiconductor device to be replaced a large number of times; (2) providing a semiconductor device-mounted apparatus including such a semiconductor device; and (3) providing a method for replacing a semiconductor device such that the replacement of the semiconductor device on the substrate can be performed a large number of times without employing any special operation members or increasing the number of steps to be performed.

These and other advantages of the present invention will become apparent to those skilled in the art upon reading and understanding the following detailed description with reference to the accompanying figures.

BRIEF DESCRIPTION OF THE DRAWINGS

FIGS. 1A and 1B are views for describing a semiconductor chip and a semiconductor device-mounted apparatus according to Example 1 of the present invention.

FIGS. 5A and 5B are views for describing a semiconductor chip and a semiconductor device-mounted apparatus according to Example 2 of the present invention.

DESCRIPTION OF THE PREFERRED EMBODIMENTS

Hereinafter, the present invention will be described by way of examples.

Example 1

Figure 1A:
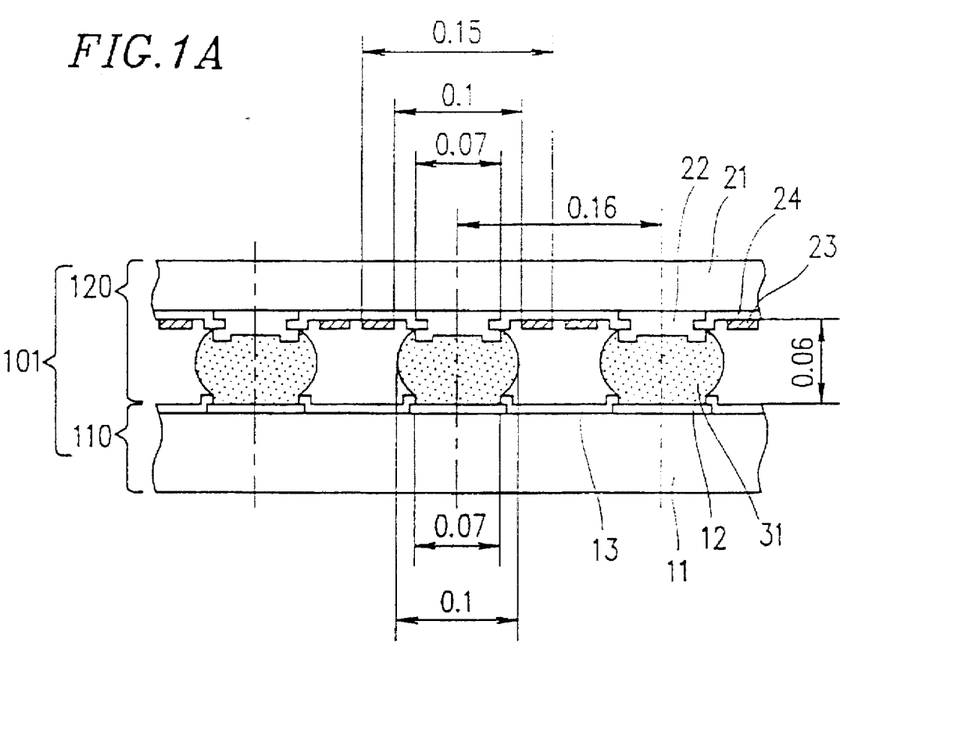
FIG. 1A shows a partial cross section of the semiconductor device-mounted apparatus.
Figure 1B:
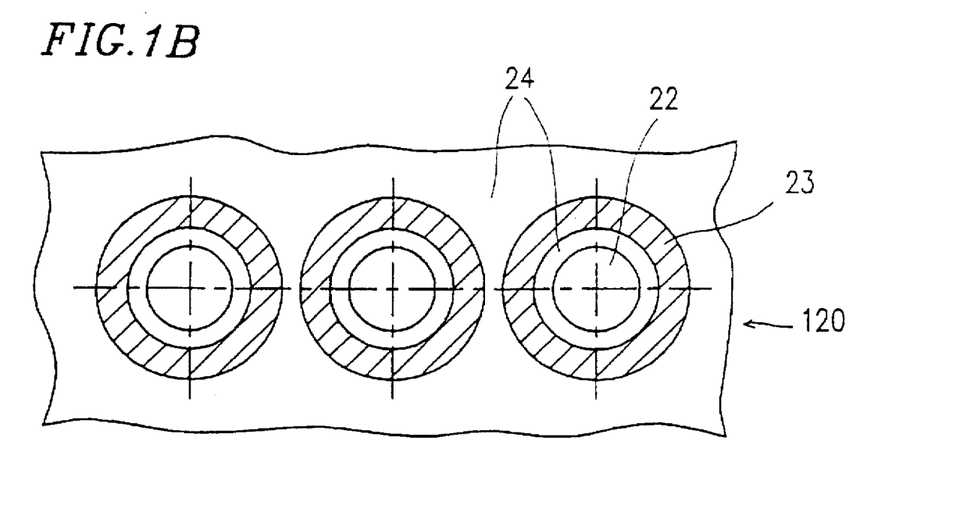
FIG. 1B shows the structure of a surface of the semiconductor chip.

FIGS. 1A and 1B are views for describing a semiconductor device-mounted apparatus 101 and a semiconductor chip 120 according to Example 1 of the present invention. FIG. 1A shows a partial cross section of the semiconductor device-mounted apparatus; FIG. 1B shows the structure of a surface of the semiconductor chip.

As shown in FIG. 1A, the semiconductor device-mounted apparatus 101 includes the semiconductor chip 120 mounted on a mounting substrate 110. In predetermined regions of a surface of a chip substrate 21 of the semiconductor chip 120, circular chip electrodes (connection electrodes) 22 are provided. A solder bump 31 is formed on each chip electrode 22. In the other regions of the surface of the chip substrate 21 excluding the chip electrodes 22, a surface insulation layer 24 composed of SiN, $SiO_2$, or the like is formed. Ring-shaped solder drawing layers 23 are formed on the surface insulation layer 24 so as to encircle each chip electrode 22 (FIG. 1B). The solder bumps 31 are omitted in FIG. 1B.

On the mounting substrate 110, substrate electrodes 12 are formed in positions corresponding to the chip electrodes 22 of the semiconductor chip 120, which is mounted on the mounting substrate 110. In regions surrounding the substrate electrodes 12, a solder resist 13 for preventing solder from flowing away is formed.

Furthermore, the chip electrodes 22 are connected to the substrate electrodes 12 of the mounting substrate 110 by the solder bump 31, so as to fix the semiconductor chip 120 onto the mounting substrate 110.

As for the material of a substrate main body 11 constituting the mounting substrate 110, known materials such as ceramics, glass, glass/epoxy-based materials (i.e., glass fibers immersed with epoxy resin), and paper/phenol-based materials (i.e., paper immersed with phenol resin) can be used. As for the material of the substrate electrodes 12, solder-agreeable metals such as Ag, Pd, Au, Ni, and Cu or alloys thereof can be used. In some cases, the substrate electrodes 12 may have a structure in which barrier metal layers, e.g., Ni or Ti, and a metal layer, e.g., W, Ti, Cr, Cu, which are used for the wiring on the substrate, are provided on a lower face of a layer composed of any of the above-mentioned solder-agreeable metals. In this case, as a result, the substrate electrodes 12 have a multilayer structure of Au/Ni/Cu or Ni/Ti/Cu, for example. The solder resist 13 is provided in order to prevent solder from flowing away in the case where the wiring on the substrate is composed of a solder-agreeable metal such as Cu. Resins such as epoxy or phenol can be used for the solder resist 13.

The chip electrodes 22 of the semiconductor chip 120 have a structure in which a barrier metal layer and a solder-agreeable metal layer are formed on an Al—Si alloy layer. Al—Si alloys are usually used as a wiring material for semiconductor devices. For example, the chip electrodes 22 have a multilayer structure of Cu/Cr/Al—Si or Ni/Ti/Al—Si.

As for the material of the solder bumps 31, a material including Pb, Sn, In, and Bi as main components is used. For example, eutectic solder of Pb–3Sn, high-temperature solder in which Pb:Sn=95:5, and common solder in which Pb:Sn=4:6 can be used.

The solder drawing layers 23, which are one of the features of the present invention, must be composed of a solder-agreeable metal at least in a surface portion thereof. For example, each solder drawing layer 23 may have such a structure that a lower portion thereof is composed of a metal layer such as Ti or Cr, which can achieve a close contact with the SiN or $SiO_2$ constituting the surface insulation layer 24.

The specific dimensions of the semiconductor device-mounted apparatus 101 are shown in FIG. 1A (by millimeters). The distance between each chip electrode 22 and each solder drawing layer 23 must not be too small to achieve insulation between the solder bumps 31 and the solder drawing layers 23, and must not be too large as compared with the diameter of the solder bumps 31 to ensure that the melted solder emerging of the solder bumps 31 melting is drawn onto the solder drawing layers 23 in their vicinity. According to the present invention, it is preferable that the distance between each chip electrode 22 and each solder drawing layer 23 accounts for about 5% to 30% of the diameter of the solder bumps 31. For example, given that each solder bump 31 has a diameter of 100 µm, as shown in FIG. 1A, the distance is preferably about 5 µm to 30 µm.

Moreover, it is preferable that the sum of the area of each solder drawing layer 23 and the area of each chip electrode 22 is equal to or greater than an area 1.25 times as large as the area of each substrate electrode 12 of the mounting substrate 110. If the sum of the areas of each solder drawing layer 23 and each chip electrode 22 is smaller than 1.25 times the area of each substrate electrode 12, the severed portion of solder may vary, thereby resulting in insufficient connection of a substitute semiconductor chip with the mounting substrate.

By employing the state-of-the-art semiconductor chip production techniques, the pitch of the chip electrodes 22 can be made smaller than 160 µm, which is the value adopted in the present example. In that case, the diameter of each solder bump 31 can also be made smaller. However, if the diameter of the solder bumps 31 becomes too small, the distance between the semiconductor chip 120 and the mounting substrate 110 of the semiconductor device-mounted apparatus 101 becomes smaller than 60 µm, which is the value adopted in the present example. This results in a larger influence of thermal stress on connection portions between the semiconductor chip 120 and the mounting substrate 110. That is, the thermal stress arising due to a difference in the coefficients of thermal expansion between the material constituting the chip substrate 21, e.g., Si or GaAs, and the material constituting the mounting substrate 110 increases, thereby lowering the reliability of the semiconductor chip 120. Therefore, the distance between the semiconductor chip 120 and the mounting substrate 110 must be larger than a predetermined value, as in the present example.

Next, the process of forming the solder bumps 31 and the solder drawing layers 23 will be described. FIGS. 2A to 2E respectively describe the consecutive steps of the process.

In FIGS. 2A to 2E, reference numeral 20 represents a semiconductor wafer on which functional circuitry including transistors and the like have already been formed. A lead electrode 22a connected to the above-mentioned functional circuitry is formed in a predetermined portion of the surface of the semiconductor wafer 20. The semiconductor wafer 20 is covered with the surface insulation layer 24 in regions of the semiconductor wafer 20 excluding the lead electrode 22a.

Figure 2A:
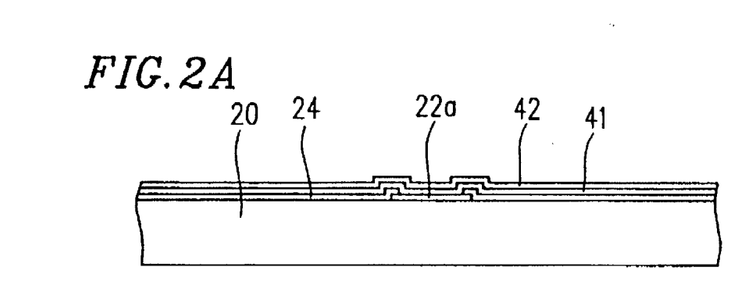
FIGS. 2A to 2E are views consecutively showing the respective steps in the process for forming solder bumps and solder drawing layers according to Example 1 of the present invention.

First, on the surface of the semiconductor wafer 20, on which the functional circuitry has been formed, a barrier metal layer 41 such as Ti, Ti—W, or Cr is formed so as to have a thickness of 0.1 µm to 0.3 µm by vapor deposition or sputtering. Subsequently, a metal layer such as Ni or Cu is formed so as to have a thickness of about 1 µm on the barrier metal layer 41 by vapor deposition or sputtering. On the metal layer of Ni or Cu, an Au layer, which has the best affinity with the solder bumps 31, is formed so as to have a thickness of 0.05 µm by non-electrolysis plating. Thus, the solder-agreeable metal layer 42 is formed (FIG. 2A).

Figure 2B:
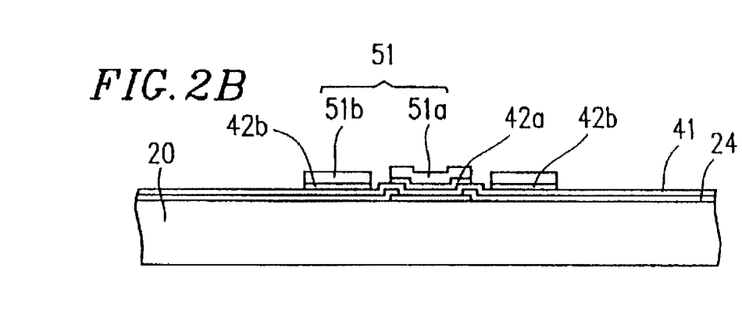

Next, a photoresist is applied on the entire surface of the semiconductor wafer 20. Through exposure and development, the photoresist film is patterned so as to form a resist film 51 for conducting a selective etching. The patterning is performed in such a way as to leave photoresist portions 51a and 51b in regions of the surface of the semiconductor wafer 20 where the chip electrodes 22 are to be formed and in regions of the surface of the semiconductor wafer 20 where the solder drawing layers 23 are to be formed, respectively. Then, by using the resist film 51 as a mask, the solder-agreeable metal layer 42, which is exposed, is subjected to a selective etching. In the case where the solde-agreeable metal layer 42 consists of an upper Au layer and a lower Ni layer, the upper Au layer is etched by an ethyl alcohol solution of iodine and iodine of potassium, and the lower Ni layer is etched by a nitric acid solution. Thus, a bump underlying layer 42a to become a foundation for the solder bump 31 is formed on the lead electrode 22a. Moreover, a solder-agreeable metal layer 42b which defines the surface of the solder drawing layer 23 is formed in a periphery of the bump underlying layer 42a (FIG. 2B).

Figure 2C:
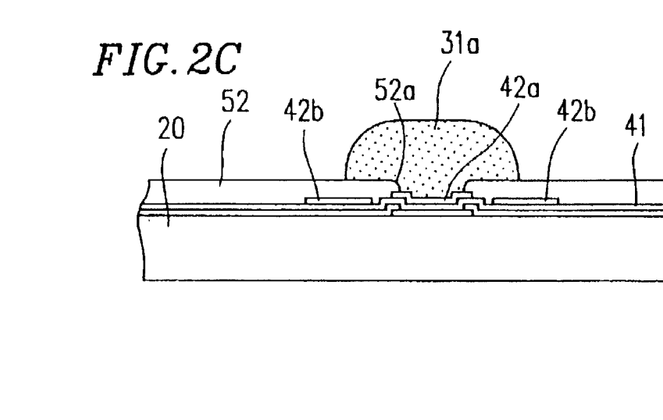

After removing the resist film 51, a photoresist is then applied to the semiconductor wafer 20 again. Through exposure and development, the photoresist is patterned so as to form a resist film 52 for conducting a selective plating, the resist film 52 having an opening 52a in a portion corresponding to the bump underlying layer 42a. Thereafter, a solder electro-plating is performed in a selective manner by using the barrier metal layer 41 as a common electrode and using the resist film 52 as a mask. As a result, a solder layer 31a to become the solder bump 31 is formed on the bump underlying layer 42a (FIG. 2C). The solder layer 31a has a height of about 30 µm.

Figures 2D, 2E:
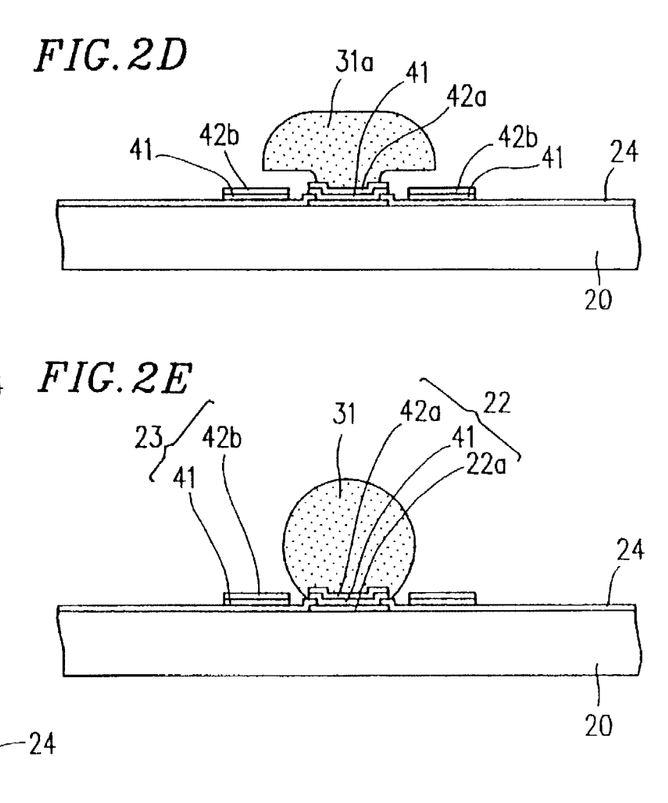

Next, after removing the resist film 52, the barrier metal layer 41 is selectively removed by using the solder layer 31a, the solder-agreeable metal layers 42a and 42b as masks, with a predetermined etchant (FIG. 2D). If the barrier metal layer 41 is Ti, for example, a mixture of ethylene diamine tetraacetic acid, a hydrogen peroxide solution, and aqueous ammonia is used as the etchant. If the barrier metal layer 41 is W, a hydrogen peroxide solution is used as the etchant. As a result, the chip electrode 22 having a structure in which the bump underlying layer 42a and the barrier metal layer 41 are laminated on the lead electrode 22a is formed. In addition, the solder drawing layer 23 having a structure in which the barrier metal layer 41 and the solder-agreeable metal layer 42b are laminated on the surface insulation film 24 is formed.

Finally, flux is applied on the surface of the semiconductor wafer 20, and a heat treatment is conducted, whereby the solder layer 31a reflows so as to form the solder bump 31 having a height of about 70 to 80 µm (FIG. 2E). Alternatively, the formation of the solder bump 31 may be achieved by reflowing the solder layer 31a while immersing the semiconductor wafer 20 in a glycerin solution kept at a high temperature, instead of the process using flux.

Thereafter, the semiconductor wafer 20 is diced so that the semiconductor chip 120 including the solder bump 31 and the solder drawing layer 23 is obtained.

The semiconductor chip 120 thus produced is mounted on the mounting substrate 110 by a mounting process, whereby the semiconductor module (semiconductor device-mounted apparatus) 101 is obtained.

The semiconductor module 101 is subjected to a selection test or a burn-in test so as to distinguish good products from bad products. The semiconductor chips of the semiconductor modules which are determined to be bad products are replaced with substitute semiconductor chips.

Hereinafter, the process for replacing the semiconductor chip will be described.

Figure 3A:
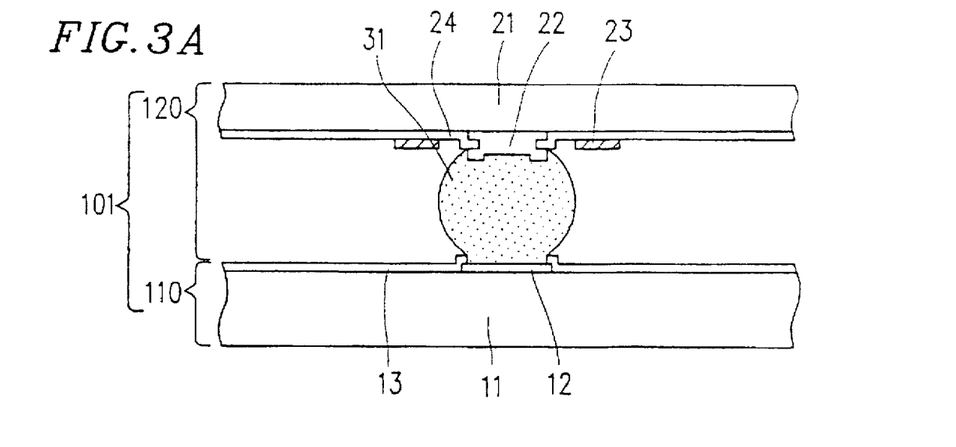
FIGS. 3A to 3C are views showing the process for removing a semiconductor chip from the semiconductor device-mounted apparatus according to Example 1 of the present invention.
Figure 3B:
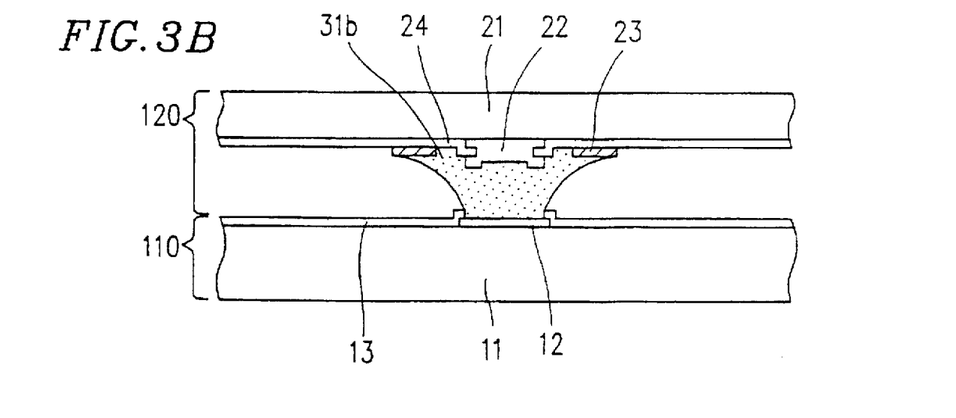
Figure 3C:
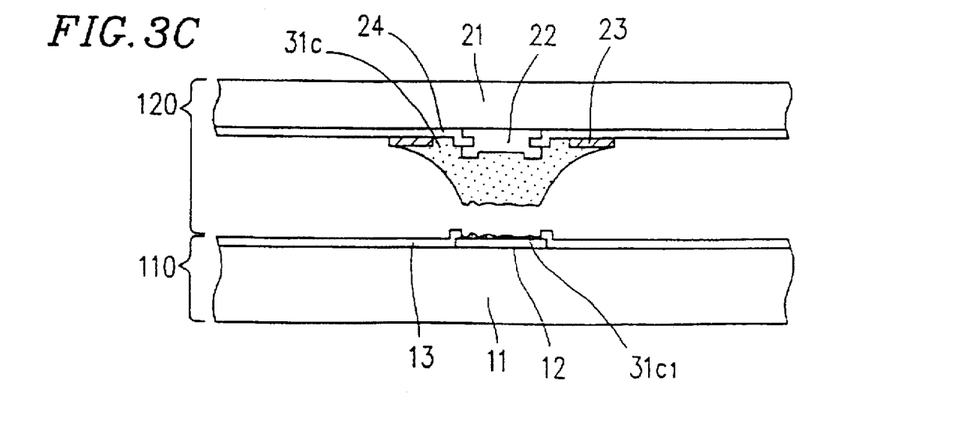
Figure 4A:
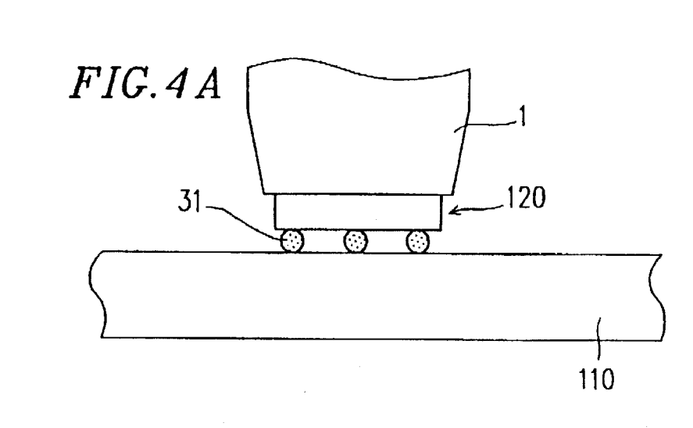
FIGS. 4A to 4D are views schematically showing the structure and operation of a mechanical tool used in a step for removing the semiconductor chip according to Example 1 of the present invention.
Figure 4B:
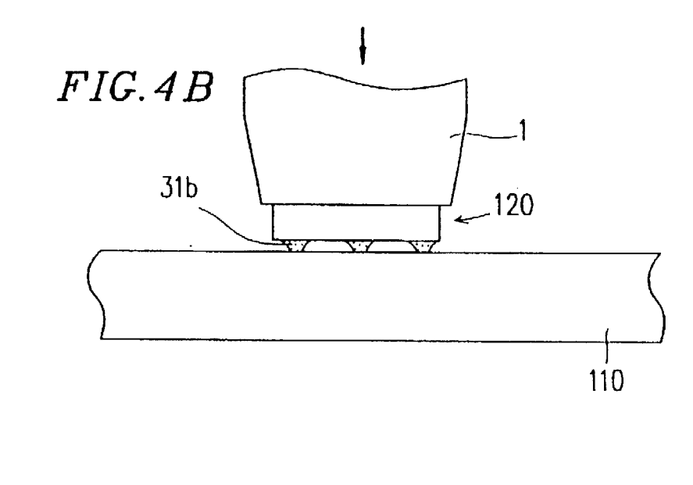
Figure 4C:
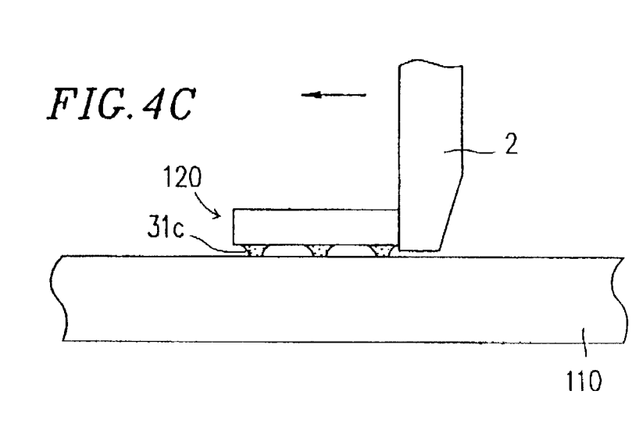

FIGS. 3A to 3C are views showing the process for removing a semiconductor chip from the semiconductor device-mounted apparatus according to Example 1 of the present invention. FIGS. 4A to 4C are views schematically showing the structure and operation of a mechanical tool used in a step for removing the semiconductor chip according to Example 1 of the present invention.

First, a pulse heating tool 1 (for example, a "Simple Type Bonder FLB-1-S": manufactured by Nitto Kogyo K.K.), is pressed onto a back face of the semiconductor chip 120 mounted on the mounting substrate 110. The solder bump 31 is heated so as to be 20° C. to 30° C. higher than the melting point of the solder (FIGS. 3A and 4A).

When the solder bump 31 is melted, the pulse heating tool 1 is moved toward the mounting substrate 110 so that the distance between the semiconductor chip 120 and the mounting substrate 110 becomes about 20 µm to 30 µm. Thus, melted solder 31b emerging from the solder bump 31 contacts with the solder drawing layer 23 in the vicinity of the chip electrode 22 so as to spread in a wet state (FIGS. 3B and 4B).

Thereafter, the pulse heating tool 1 is cooled so that the melted solder 31b which is spread over the solder drawing layer 23 is solidified.

Substantially no oxidation occurs on the surface of the solder bump 31 while the melted solder 31b is drawn onto the solder drawing layer 23, since the connection of the chip electrode 22 with the substrate electrode 12 is conducted through a reflowing process under a nitrogen atmosphere. Even if some oxidation occurs on the surface of the solder bump 31, the melting solder bump 31 is physically deformed during the above-mentioned movement of the semiconductor chip 120, so that new surfaces are created on the solder. As a result, the solder becomes adhered to the solder drawing layer 23. Moreover, even if excessive oxidation occurs on the surface of the solder bump 31, the solder can be made wet by applying flux thereon.

Figure 4D:
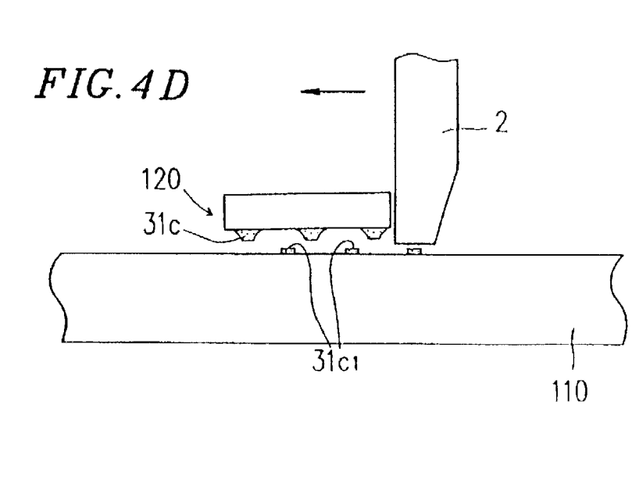

Next, the semiconductor device-mounted apparatus 101 is set onto a chip removal tool (PULLTESTER PTR100S: manufactured by Rhesca K. K.). Force is applied to the semiconductor chip 120 in a direction parallel to an interface between the semiconductor chip 120 and the mounting substrate 110 (FIG. 4C) by means of a chip pressing piece 2 of the chip removal tool so as to remove the semiconductor chip 120 from the mounting substrate 110 (FIGS. 3C and 4D). At this time, solidified solder 31c which connects with the chip electrode 22 and the solder drawing layer 23 of the semiconductor chip 120 and the substrate electrode 12 of the mounting substrate 110 is severed in the vicinity of the substrate electrode 12 due to a difference between the semiconductor chip side and the mounting substrate side in the areas of the portions which the solder 31c connects with. Specifically, since the area of the portion the solder 31c connects with on the mounting substrate side is smaller than the area of the portions the solder 31c connects with on the semiconductor chip side, the solder 31c is severed nearer the substrate electrode 12. As a result, only a very small amount of solder residues remain on the substrate electrode 12 of the mounting substrate 110, the amounts of the solder residues on all the substrate electrodes 12 being equal.

Thereafter, a substitute semiconductor chip is mounted on the portion of the mounting substrate 110 where the bad semiconductor chip 120 was located. Thus, the replacement of the semiconductor chip is completed.

As described above, according to the present example, the semiconductor chip 120 includes the solder drawing layers 23 which draw the melted solder by contact with the melted solder bumps 31, the solder drawing layers 23 being provided in a periphery of the solder bumps 31. When the semiconductor chip 120 is removed from the mounting substrate 110, the semiconductor chip 120 is brought closer to the mounting substrate 110 side while heating the semiconductor chip 120 at a temperature that allows the solder to melt, so that the melted solder 31b present between the chip electrodes 22 of the semiconductor chip 120 and the substrate electrodes 12 of the mounting substrate 110 is drawn onto the solder drawing layers 23 provided in the vicinity of the solder bumps 31. As a result, most of the solder present in the portion connecting the chip electrodes 22 and the substrate electrodes 12 is retracted to the semiconductor chip 120 side. When the semiconductor chip 120 is pulled away from the mounting substrate 110, most solder remains on the chip electrode 22 and the solder drawing layer 23, that is, removed from the substrate electrodes 12.

Moreover, solder residues $31c_1$ remaining on the substrate electrodes 12 when the semiconductor chip 120 is removed from the mounting substrate 110 can be substantially eliminated, so that the substrate electrodes 12 are ready to be satisfactorily soldered to the chip electrodes 22 of a substitute semiconductor chip. As a result, the problems of short-circuiting and malconnection of the substitute semiconductor device due to fluctuation in the solder amount are prevented from happening.

Furthermore, when exchanging semiconductor chips, the solder residues that remain on the mounting substrate 110 after removing the old semiconductor chip need not be eliminated by a separate process. Therefore, it is easy to connect a substitute semiconductor chip on the mounting substrate 110. Similar exchanging processes can be repeated, thereby allowing for more than one replacements of the semiconductor chip.

According to the present example, the solder drawing layers 23 are formed only in the vicinity of the solder bumps 31 on the surface of the semiconductor chip 120, so that the difference in the coefficients of thermal expansion between the material constituting the semiconductor chip 120 and the material constituting the solder drawing layers 23 does not result in unfavorably affecting the semiconductor chip 120.

Furthermore, this structure is also effective in cases where it is impossible to form solder drawing layers in active areas of a semiconductor chip, i.e., regions in which active elements and the like are formed, e.g., in cases where metal layers constituting the solder drawing layers form capacitors along with connection electrodes of the semiconductor chip so as to unfavorably affect the operation of the semiconductor chip.

Moreover, according to the present example, the solder bumps 31 connecting the substrate electrodes 12 with the chip electrodes 22 are melted so as to be drawn onto the solder drawing layer 23 and thereafter solidified by cooling, after which the semiconductor chip 120 is pulled off with force applied in a direction parallel to the mounting substrate 110. As a result, even if the solder drawing layers 23 are provided only in the vicinity of the solder bumps 31, the solder is severed in the vicinity of the substrate electrode 12 due to a difference between the semiconductor chip side and the mounting substrate side in the areas of the portions the solder connects with. Therefore, the semiconductor chip 120 can be removed leaving only a small amount of solder residues $31c_1$ on the substrate electrodes 12 of the mounting substrate 110. The removal of the semiconductor chip 120 is simple because it merely includes moving the semiconductor chip 120 while heating the semiconductor chip 120, cooling the semiconductor chip 120, and removing the semiconductor chip 120 from the mounting substrate 110.

Example 2

Figure 5A:
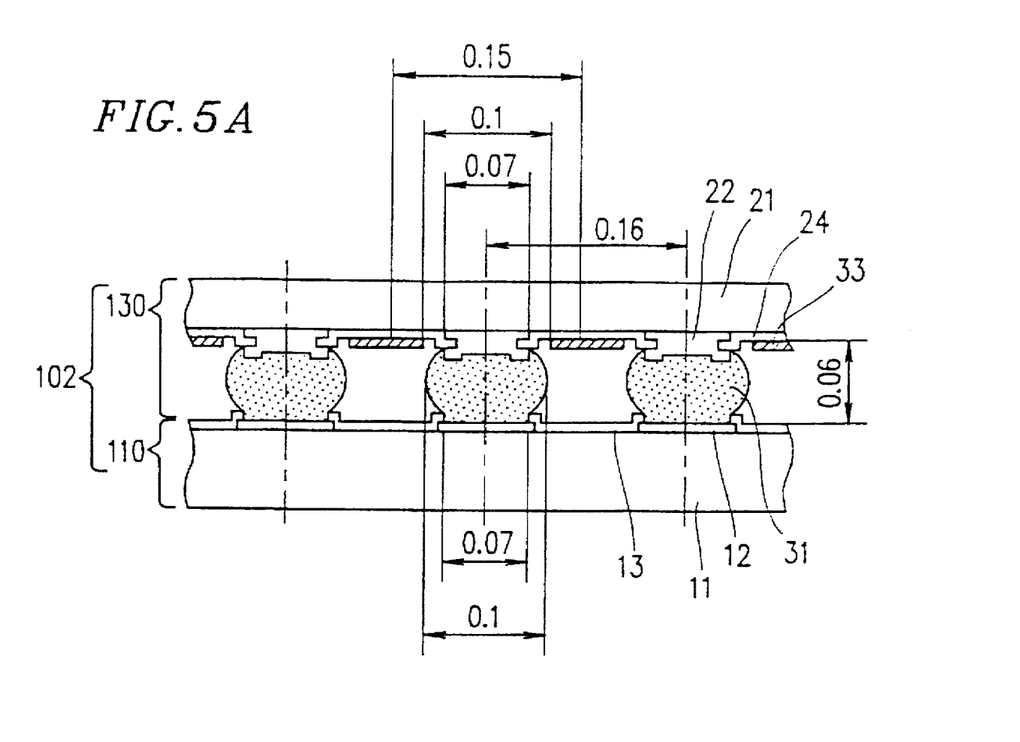
FIG. 5A shows a partial cross section of the semiconductor device-mounted apparatus.
Figure 5B:
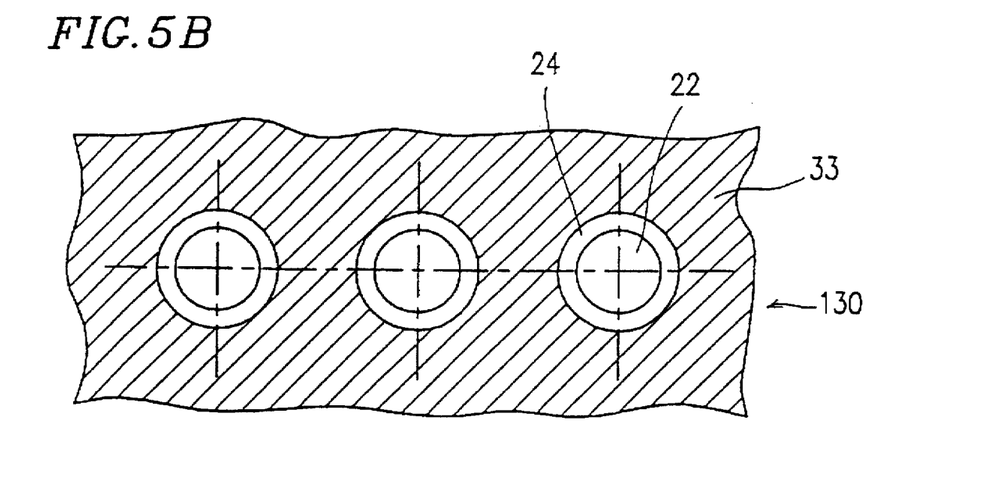
FIG. 5B shows the structure of a surface of the semiconductor chip.

FIGS. 5A and 5B are views for describing a semiconductor chip 130 and a semiconductor device-mounted apparatus 102 according to Example 2 of the present invention. FIG. 5A shows a partial cross section of the semiconductor device-mounted apparatus; FIG. 5B shows the structure of a surface of the semiconductor chip.

As shown in FIG. 5A, the semiconductor device-mounted apparatus 102 includes the semiconductor chip 130 mounted on a mounting substrate 110. As opposed to the semiconductor chip 120 of Example 1, the semiconductor chip 130 of the present example includes a solder drawing layer 33 which extends substantially over the entire surface of the semiconductor chip 130, rather than only in the vicinity of chip electrodes 22. Otherwise, the semiconductor chip 130 has the same structure as that of the semiconductor chip 120 of Example 1.

In Example 2 as well, it is preferable that the distance between each chip electrode 22 and the solder drawing layer 33 accounts for about 5% to 30% of the diameter of the solder bumps 31.

Next, the process of forming the solder bumps 31 and the solder drawing layer 33 will be briefly described.

FIGS. 6A to 6E are views respectively showing the consecutive steps in the process for forming solder bumps and solder drawing layers according to the present example. FIGS. 7A to 7C are views showing the process for removing a semiconductor chip from the semiconductor device-mounted apparatus according to the present example. FIGS. 8A to 8D are views schematically showing the structure and operation of a mechanical tool used in a step for removing the semiconductor chip according to the present example.

Figure 6A:
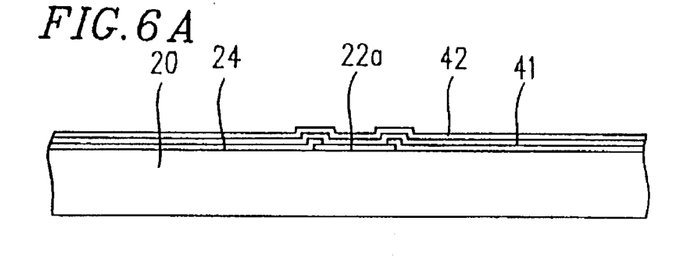
FIGS. 6A to 6E are views consecutively showing the respective steps in the process for forming solder bumps and solder drawing layers according to Example 2 of the present invention.
Figure 6B:
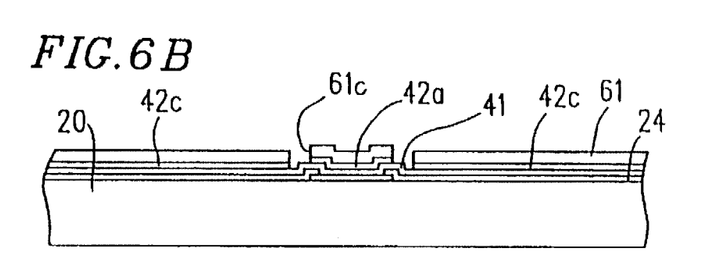
Figure 7A:
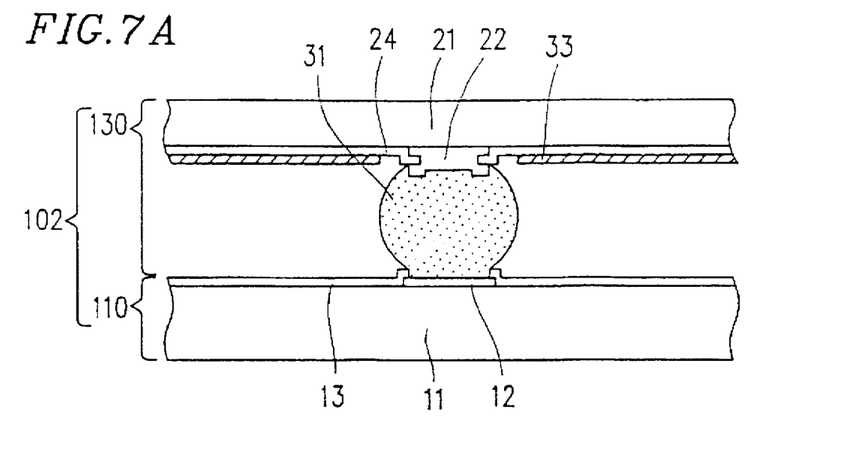
FIGS. 7A to 7C are views showing the process for removing a semiconductor chip from the semiconductor device-mounted apparatus according to Example 2 of the present invention.
Figure 7B:
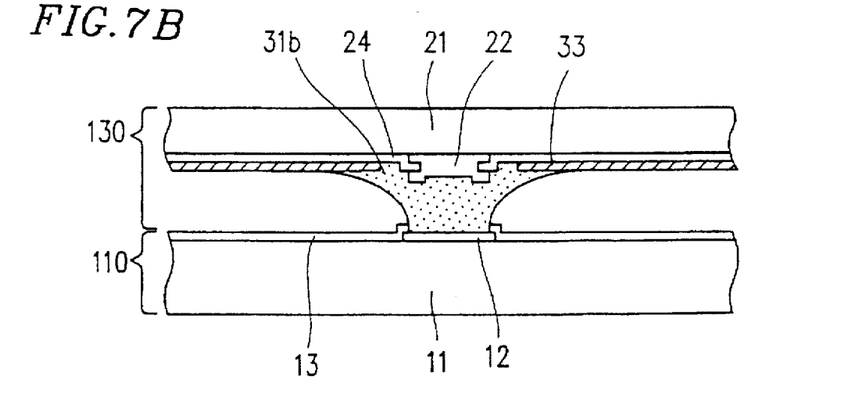
Figure 7C:
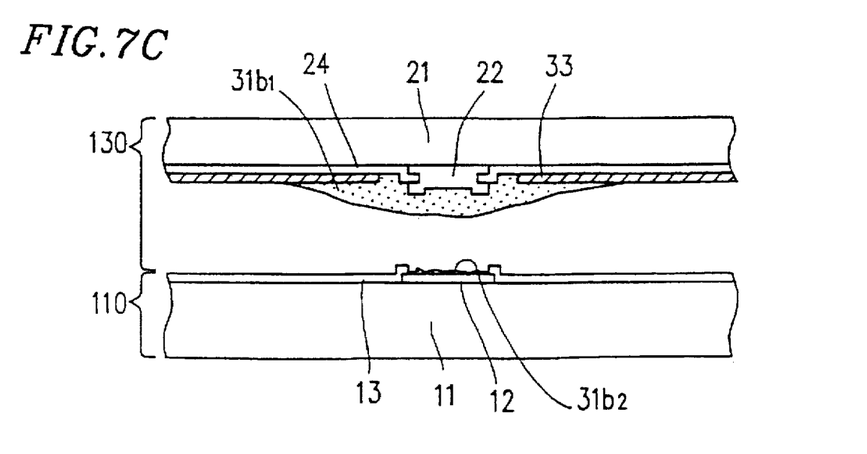

First, a barrier metal layer 41 and a solder-agreeable metal layer 42 are formed on the surface of a semiconductor wafer 20 as in Example 1 (FIG. 6A). Next, a photoresist is applied on the entire surface of the semiconductor wafer 20. Through exposure and development, the photoresist film is patterned so as to form a resist film 61 for conducting a selective etching. The patterning is performed in such a way that the resist film 61 has an opening 61c in the periphery of a lead electrode 22a on the semiconductor wafer 20. By using the resist film 61 as a mask, the solder-agreeable metal layer 42, which is exposed, is subjected to a selective etching. In the case where the solder-agreeable metal layer 42 consists of an upper Au layer and a lower Ni layer, the upper Au layer is etched by an ethyl alcohol solution of iodine and iodine of potassium, and the lower Ni layer is etched by a nitric acid solution. Thus, a bump underlying layer 42a to become a foundation for the solder bump 31 is formed on the lead electrode 22a. Moreover, a solder-agreeable metal layer 42c which defines the surface of the solder drawing layer 33 is formed in a periphery of the bump underlying layer 42a (FIG. 6B).

Figure 6C:
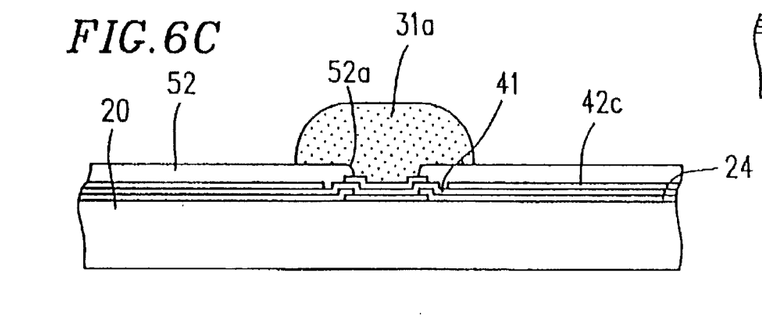

Next, the resist film 61 is removed. As in Example 1, by using a resist film 52 having an opening 52a in a portion corresponding to a bump underlying layer 42a, a solder electro-plating is performed in a selective manner. This results in a solder layer 31a which is to become the solder bump 31, being formed on the bump underlying layer 42a (FIG. 6C).

Figure 6D:
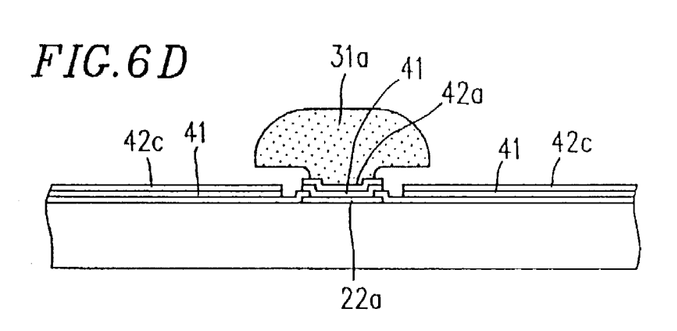

Next, after removing the resist film 52, the barrier metal layer 41 is selectively removed by using the solder layer 31a, the solder-agreeable metal layers 42a and 42c as masks, with a predetermined etchant (FIG. 6D). If the barrier metal layer 41 is Ti, for example, a mixture of ethylene diamine tetraacetic acid, a hydrogen peroxide solution, and aqueous ammonia is used as the etchant. If the barrier metal layer 41 is W, a hydrogen peroxide solution is used as the etchant. As a result, the chip electrode 22 having a structure in which the bump underlying layer 42a and the barrier metal layer 41 are laminated on the lead electrode 22a is formed. In addition, the solder drawing layer 33 having a structure in which the barrier metal layer 41 and the solder-agreeable metal layer 42c are laminated on the surface insulation film 24 is formed.

Figure 6E:
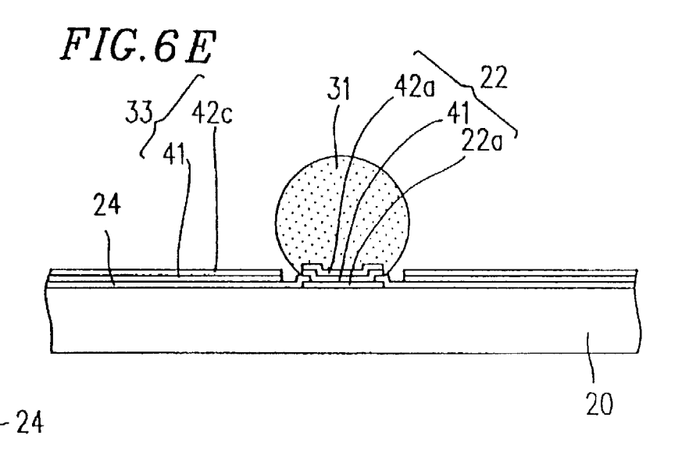

Finally, flux is applied on the surface of the semiconductor wafer 20, and a heat treatment is conducted, whereby the solder layer 31a reflows so as to form the solder bump 31 having a height of about 70 to 80 µm (FIG. 6E).

Thereafter, the semiconductor wafer 20 is diced so that the semiconductor chip 130 including the solder bump 31 and the solder drawing layer 33 is obtained.

The semiconductor chip 130 thus produced is mounted on the mounting substrate 110 by a mounting process, whereby the semiconductor module (semiconductor device-mounted apparatus) 102 is obtained.

The semiconductor module 102 is subjected to a selection test or a burn-in test so as to distinguish good products from bad products. The semiconductor chips of the semiconductor modules which are determined to be bad products are replaced with substitute semiconductor chips.

Figure 8A:
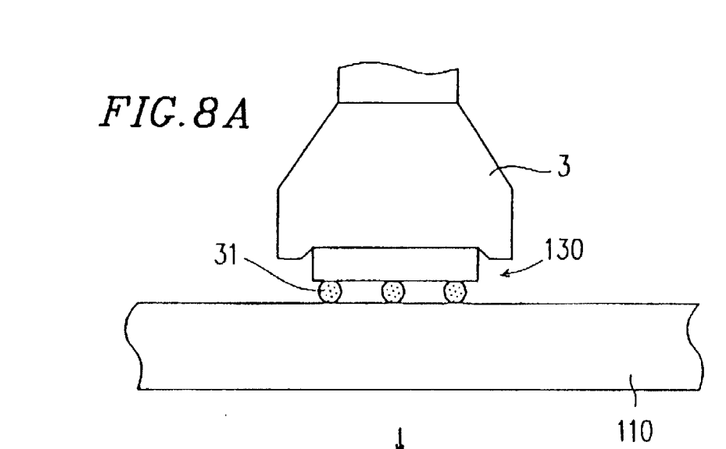
FIGS. 8A to 8D are views schematically showing the structure and operation of a mechanical tool used in a step for removing the semiconductor chip according to Example 2 of the present invention.
Figure 8B:
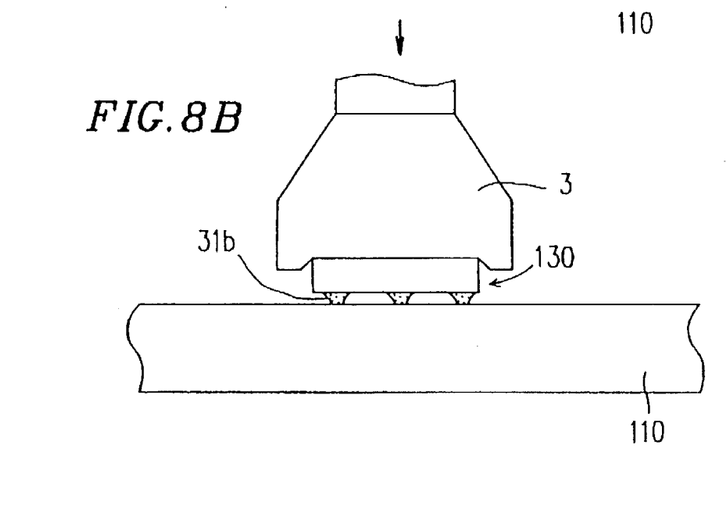

Hereinafter, the process for replacing the semiconductor chip will be described with reference to FIGS. 7 and 8.

First, a vacuum chuck 3 ("Simple Type Bonder FLB-1-S": manufactured by Nitto Kogyo K.K.) including a heating means, for example a heater, is pressed onto a back face of the semiconductor chip 130 mounted on the mounting substrate 110. Thus, the solder bump 31 is heated so as to be 20° C. to 30° C. higher than the melting point of the solder (FIGS. 7A and 8A).

When the solder bump 31 is melted, the vacuum chuck 3 is moved toward the mounting substrate 110 side so that the distance between the semiconductor chip 130 and the mounting substrate 110 becomes about 20 µm to 30 µm. Thus, melted solder 31b, melting due to the heating, emerges from the solder bump 31 and contacts with the solder drawing layer 33 in the vicinity of the chip electrode 22 so as to spread in a wet state (FIGS. 7B and 8B).

Figures 8C, 8D:
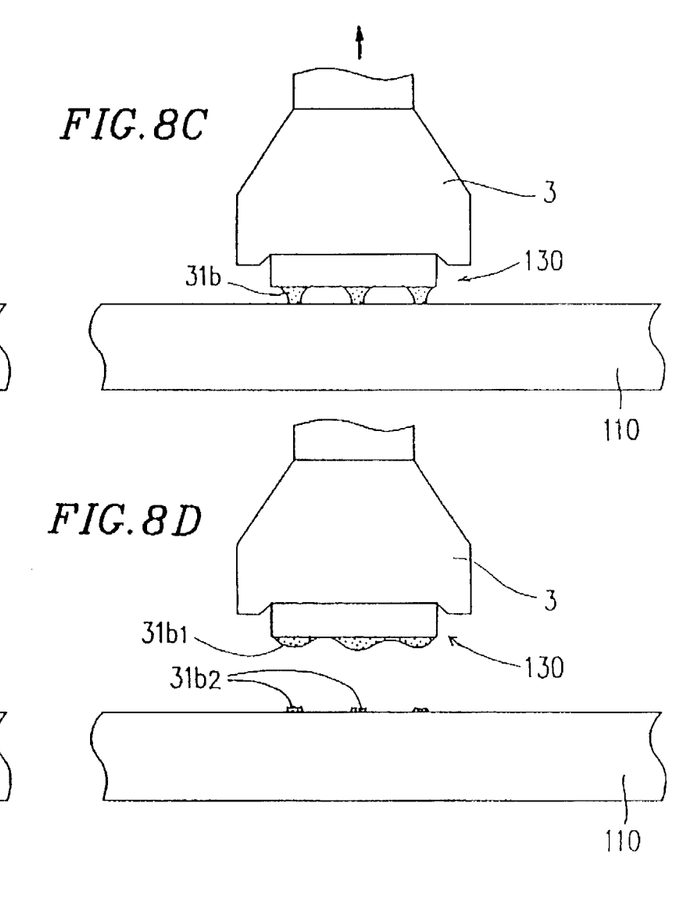

Thereafter, the vacuum chuck 3 is pulled up with the melted solder 31b spread over the solder drawing layer 33 (FIG. 8C). Thus, most of the melted solder 31b is retracted toward the semiconductor chip 130 side, that is, removed from the mounting substrate 110 (FIGS. 7C and 8D).

Since the solder 31b connected with the substrate electrode 12 of the mounting substrate 110 and the chip electrode 22 of the semiconductor chip 130 spreads in a wet state over the solder drawing layer 33 having a large area, a large portion $31b_1$ of the melted solder 31b is pulled toward the semiconductor chip 130 so as to be removed from the substrate electrode 12. As a result, only a very small amount of solder residues remain on the substrate electrode 12 of the mounting substrate 110, the amounts of the solder residues on all the substrate electrodes 12 being equal.

Thereafter, a substitute semiconductor chip is mounted on the portion of the mounting substrate 110 where the bad semiconductor chip 130 was located. Thus, the replacement of the semiconductor chip is completed.

As described above, according to the present example, as well as in Example 1, the semiconductor chip 130 includes the solder drawing layers 33 which draw the melted solder thereon by contact with the melted solder bumps 31, the solder drawing layers 33 being provided in a periphery of the solder bumps 31. The removal of the semiconductor chip 130 from the mounting substrate 110 is performed simply by pressing the semiconductor chip 130 toward the mounting substrate 110 side while being heated and lifting up the semiconductor chip 130 from the mounting substrate 110.

Moreover, solder residues $31b_2$ remaining on the substrate electrodes 12 when the semiconductor chip 130 is removed from the mounting substrate 110 can be substantially eliminated, so that the substrate electrodes 12 are ready to be satisfactorily soldered to the chip electrodes 22 of a substitute semiconductor chip over and over. As a result, more than one replacements of the semiconductor chip is enabled.

According to the present example, the solder drawing layer 33 is formed in a sufficient area in the periphery of the solder bumps 31, so that the melted solder is adequately drawn onto the solder drawing layer 33. As a result, there is no need for cooling the melted solder so as to solidify it as in Example 1.

According to the present example, the solder drawing layer 33 substantially covers the entire surface of the semiconductor chip 130 except for the chip electrodes 22. As a result, another advantage is provided in that light is prevented from entering the interior of the semiconductor chip 120, thereby preventing the circuitry from malfunctioning due to such light.

In accordance with the structure of the semiconductor device-mounted apparatus 102 of the present example, where the solder drawing layer 33 occupies a large area on the surface of the semiconductor chip 130, the semiconductor chip 130 may suffer a large thermal stress due to the difference in the coefficients of thermal expansion between the metal layer constituting the solder drawing layer 33 and the chip substrate constituting the semiconductor chip 130.

Figure 9:
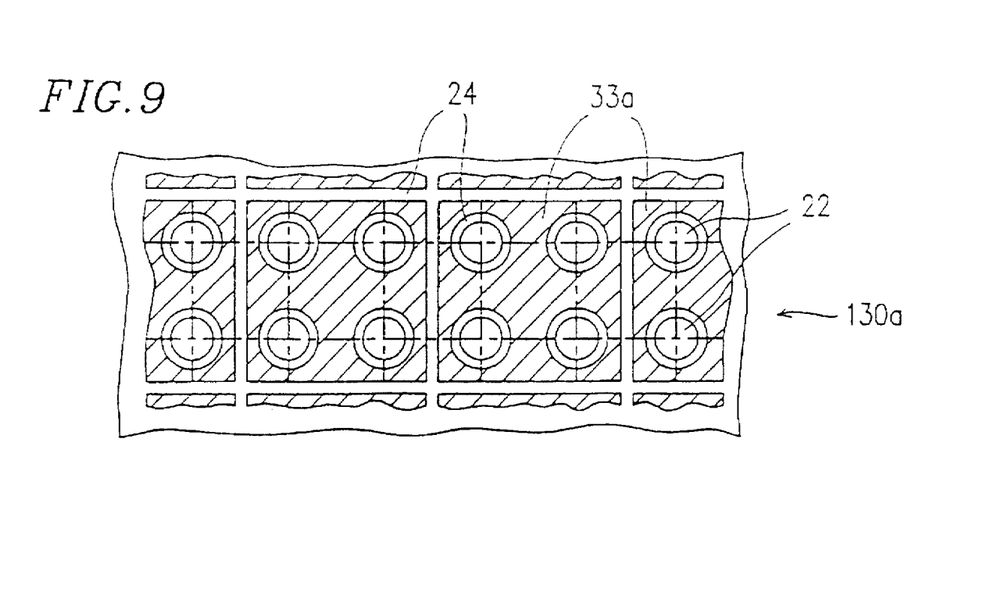
FIG. 9 is a view showing the surface structure of a variant of the semiconductor chip according to Example 2 of the present invention.

In such cases, as shown in FIG. 9 as a variant of Example 2, the solder drawing layer 33 may be divided into smaller portions 33a each including two or more adjoining chip electrodes 22, thereby decreasing the influence of the thermal stress on a semiconductor chip 130a. Thus, the semiconductor chip 130a not only prevents light from entering the interior thereof but also allows the thermal stress occurring between the portions 33a of the solder drawing layer 33a and the chip substrate to dissipate.

Figure 10:
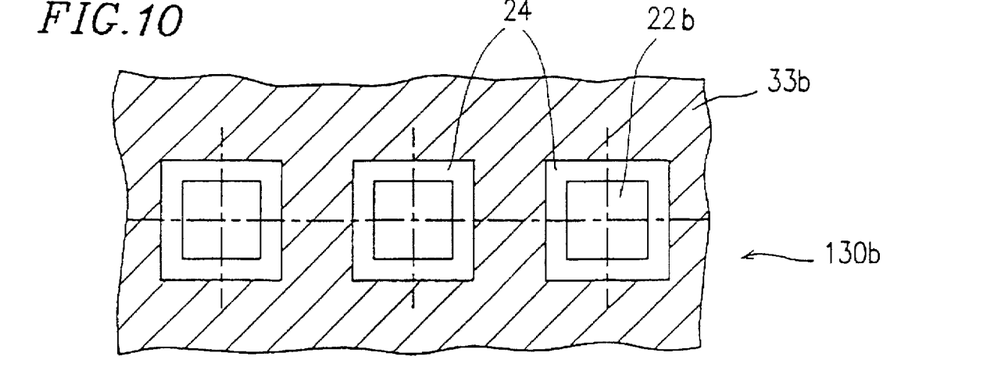
FIG. 10 is a view showing the surface structure of another variant of the semiconductor chip according to Example 2 of the present invention.

Although the chip electrodes 22 in Examples 1 and 2 were shown to have a circular planar pattern, the chip electrodes 22 may have other planar patterns. For example, as shown in FIG. 10 as another variant of Example 2, a semiconductor chip 130b in which chip electrodes 22b have a square planar pattern falls within the scope of the present invention. In this case, a solder drawing layer 33b is provided at a predetermined distance from the chip electrodes 22b in accordance with the square pattern of the chip electrodes 22b.

Although a semiconductor chip was described as an example of a semiconductor device to be mounted on a substrate, a semiconductor package or a hybrid circuit board carrying a plurality of elements mounted thereon may be used as a semiconductor device. The present invention is applicable to the case where such semiconductor packages and hybrid circuit boards are connected to a substrate by means of solder bumps.

The present invention does not intend to provide any limitations as to the method for forming the solder drawing layer(s). An appropriate method for forming the solder drawing layer(s) is selected depending on the specific needs.

Thus, according to the present invention, a solder drawing layer is provided which draws the melted solder thereon by contact with the melted solder bumps, the solder drawing layer being provided in a periphery of the solder bumps. When a semiconductor device is removed from a substrate, the semiconductor device is brought closer to the substrate while heating the semiconductor device at a temperature that allows the solder to melt, so that the melted solder present between connection electrodes of the semiconductor device and substrate electrodes of the mounting substrate is drawn onto the solder drawing layer provided in the vicinity of the solder bumps. As a result, most of the solder present in the portion connecting the connection electrodes and the substrate electrodes is retracted to the semiconductor device side. When the semiconductor device is pulled away from the mounting substrate, most solder, as well as the semiconductor device, is removed from the substrate electrodes. As a result, the problems of short-circuiting and malconnection of the substitute semiconductor device due to fluctuation in the solder amount are prevented from happening when mounting a substitute semiconductor device on the mounting substrate.

Furthermore, when exchanging semiconductor chips, the solder residues that remain on the mounting substrate after removing the old semiconductor chip need not be eliminated by a separate process. Therefore, it is easy to connect a substitute semiconductor chip on the mounting substrate, and similar exchanging processes can be repeated, thereby allowing for more than one replacements of the semiconductor chip.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device to be mounted on a mounting substrate, the semiconductor device comprising:
   a connection electrode formed on a surface of the semiconductor device;
   a solder bump formed on the connection electrode, the solder bump electrically and mechanically connecting the connection electrode with a substrate electrode formed on the mounting substrate; and a solder drawing layer provided on the surface of the semiconductor device in a periphery of the solder bump and having a surface portion composed of a solder-agreeable material, the solder drawing layer retracting melted solder of the solder bump onto a surface of the solder drawing layer by contact with the melted solder.

2. A semiconductor device according to claim 1, wherein the solder drawing layer is provided only in a vicinity of the solder bump on the surface of the semiconductor device.

3. A semiconductor device according to claim 1, wherein the solder drawing layer is formed substantially over an entire area of the surface of the semiconductor device except for a region in which the connection electrode is located.

4. A semiconductor device according to claim 1, wherein the connection electrode formed on the surface of the semiconductor device has a circular shape and the solder drawing layer has a ring shape surrounding the connection electrode.

5. A semiconductor device according to claim 1, wherein the solder drawing layer is formed substantially over an entire area of the surface of the semiconductor device except for a region in which the connection electrode is located, and the solder drawing layer is divided into a plurality of regions so as to correspond to a predetermined number of the connection electrodes.

6. A semiconductor device according to claim 1, wherein the connection electrode formed on the surface of the semiconductor device has a square shape, and the solder drawing layer is formed so as to surround the connection electrode.

7. A semiconductor device according to claim 1, wherein the connection electrode formed on the surface of the semiconductor device has a circular shape, and the connection electrode is disposed at a distance from the solder drawing layer disposed in a vicinity of the connection electrode, the distance accounting for 5% to 30% of a diameter of the solder bump.

8. A semiconductor device according to claim 1, wherein a sum of an area occupied by one connection electrode and an area occupied by one solder drawing layer corresponding to one connection electrode is equal to or greater than 1.25 times an area of one substrate electrode corresponding to the one connection electrode.

9. A semiconductor device according to claim 4, wherein the ring shape constitutes a continuous, unbroken ring.

10. A semiconductor device according to claim 1, wherein a distance between each connection electrode and each solder drawing layer accounts for five to thirty percent of a diameter of the solder bumps.

11. A semiconductor device according to claim 1, wherein the solder-agreeable material is composed of a solder-agreeable metal.

12. A semiconductor device-mounted apparatus comprising a semiconductor device mounted on a mounting substrate, wherein the mounting substrate comprises a substrate electrode formed in a predetermined position of a surface of the mounting substrate, and the semiconductor device comprises:

a connection electrode formed on a surface of the semiconductor device;

a solder bump formed on the connection electrode, the solder bump electrically and mechanically connecting the connection electrode with the substrate electrode of the mounting substrate; and a solder drawing layer provided on the surface of the semiconductor device in a periphery of the solder bump and having a surface portion composed of a solder-agreeable material, the solder drawing layer retracting melted solder of the solder bump onto a surface of the solder drawing layer by contact with the melted solder.

13. A semiconductor device-mounted apparatus according to claim 12, wherein the solder drawing layer is provided only in a vicinity of the solder bump on the surface of the semiconductor device.

14. A semiconductor device-mounted apparatus according to claim 12, wherein the solder drawing layer is formed substantially over an entire area of the surface of the semiconductor device except for a region in which the connection electrode is located.

15. A semiconductor device-mounted apparatus according to claim 12, wherein the mounting substrate comprises a solder resist formed in a periphery of the substrate electrode, the solder resist preventing the solder from flowing off the substrate electrode.

16. A semiconductor device according to claim 12, wherein the solder drawing layer forms a continuous ring shape surrounding the connection electrode.

17. A semiconductor device-mounted apparatus according to claim 12, wherein a distance between the connection electrode and the solder drawing layer accounts for five to thirty percent of a diameter of the solder bump.

18. A semiconductor device-mounted apparatus according to claim 12, wherein the solder-agreeable material is composed of a solder-agreeable metal.

* * * * *